United States Patent
Myer et al.

(10) Patent No.: US 6,363,120 B1
(45) Date of Patent: Mar. 26, 2002

(54) APPARATUS AND METHOD FOR EXTENDING THE DYNAMIC RANGE OF A MIXER USING FEED FORWARD DISTORTION REDUCTION

(75) Inventors: Robert Evan Myer, Denville; Mohan Patel, Edison; Jack Chi-Chieh Wen, Parsippany, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/098,784

(22) Filed: Jun. 17, 1998

(51) Int. Cl.[7] .............................................. H03B 14/04
(52) U.S. Cl. ...................... 375/254; 375/285; 375/296; 375/349; 455/278.1; 455/296; 455/304
(58) Field of Search ................................ 375/254, 284, 375/285, 295, 296, 346, 349, 350, 351; 455/296, 302, 304, 305, 278.1

(56) References Cited

U.S. PATENT DOCUMENTS

| 4,126,828 A | * 11/1978 | Kumagai ..................... 325/472 |
| 4,363,138 A | * 12/1982 | Franklin et al. ............. 455/226 |
| 4,383,334 A | * 5/1983 | Epsom ......................... 455/295 |

(List continued on next page.)

FOREIGN PATENT DOCUMENTS

| GB | 1495264 A | 2/1974 | ............. H03F/1/32 |
| GB | 2296615 A | 7/1996 | ............. H03F/1/32 |
| GB | 2318938 A | 5/1997 | ............. H03F/1/32 |

OTHER PUBLICATIONS

"Expanding Bit Resolution Of an A to D converter, Dec. 1967." IBM Technical Disclosure Bulletin, vol. 10, No. 7, pp. 919–920, XP002116707, New York, US.
Patent Abstracts of Japan, vol. 015, No. 269 (E1087), Jul. 9, 1991 & JP03089627A (Teac Corp), Apr. 15, 1991.

(List continued on next page.)

Primary Examiner—Stephen Chin
Assistant Examiner—Dac V. Ha
(74) Attorney, Agent, or Firm—Oliff & Berridge PLC

(57) ABSTRACT

A frequency mixing system provides an expanded dynamic range when compared to the dynamic range(s) of an individual mixer(s) that make up the arrangement. The frequency mixing system uses a feed-forward arrangement to reduce the distortion emanating from a single mixer due to a signal power level which would result in a frequency converted signal outside the dynamic range of the mixer. For example, the frequency mixing system splits an input signal onto a first path and a second path. On the first path, a first mixer frequency mixes the signal to produce a frequency converted signal with distortion, such as intermodulation distortion. On the second path, the amplitude of the signal is attenuated then frequency mixed by a second mixer to produce a frequency converted signal with a low and/or insignificant level of distortion. The first mixer element produces a frequency converted signal with distortion because the signal on the first path enters the first mixer at a power level resulting in a frequency converted signal outside the dynamic range of the first mixer. As such, the higher power level of the signal into the first mixer creates distortion that emanates from the first mixer along with the frequency converted signal. Since the attenuated signal on the second path enters the second mixer at a lower power level resulting in a frequency converted signal within the dynamic range of the second mixer, the second mixer produces the frequency converted signal with the low and/or insignificant level of distortion. After the signals on the first and second paths are frequency converted, the frequency converted signal and distortion are coupled from the first path and combined with the frequency converted signal on the second path, producing the distortion as the prominent signal on the second path. The distortion on the second path is then combined with the frequency converted signal and distortion on the first path to cancel the distortion on the first path and produce the desired frequency converted signal with reduced distortion as compared to the distortion produced if the original input signal would be frequency converted using only the first mixer.

22 Claims, 2 Drawing Sheets

U.S. PATENT DOCUMENTS

| | | | | |
|---|---|---|---|---|
| 4,408,352 A | * | 10/1983 | Dudding | |
| 4,580,105 A | | 4/1986 | Myer | 330/149 |
| 4,583,049 A | | 4/1986 | Powell | 330/151 |
| 4,665,560 A | | 5/1987 | Lange | 455/249 |
| 4,885,551 A | | 12/1989 | Myer | 330/52 |
| 4,926,136 A | | 5/1990 | Olver | 330/149 |
| 5,012,490 A | | 4/1991 | Myer | 375/58 |
| 5,132,639 A | * | 7/1992 | Blauvelt et al. | 330/149 |
| 5,155,448 A | * | 10/1992 | Powell | 330/149 |
| 5,166,634 A | * | 11/1992 | Narahashi et al. | 330/151 |
| 5,304,945 A | | 4/1994 | Myer | 330/149 |
| 5,321,847 A | * | 6/1994 | Johnson, Jr. | 455/63 |
| 5,430,893 A | | 7/1995 | Myer | 455/209 |
| 5,455,537 A | * | 10/1995 | Larkin et al. | 330/52 |
| 5,619,168 A | | 4/1997 | Myer | 330/149 |
| 5,847,603 A | | 12/1998 | Myer | 330/52 |
| 5,877,653 A | * | 3/1999 | Kim et al. | 330/149 |

OTHER PUBLICATIONS

Seifert, E. et al.: "Enhancing The Dynamic Range Of Analog–To–Digital Converters By Reducing Excess Noise," proceedings of the Pacific Rim Conference on Communications, Computers & Signal Processing, Victoria, Jun. 1–2, 1989, pp. 574–576, Institute of Electrical & Electronics Engineers.

* cited by examiner

APPARATUS AND METHOD FOR EXTENDING THE DYNAMIC RANGE OF A MIXER USING FEED FORWARD DISTORTION REDUCTION

BACKGROUND OF THE INVENTION

1. Field of The Invention

This invention relates to frequency mixing of signals and, more particularly, to a frequency mixer with an extended dynamic range which uses feed forward distortion reduction.

2. Description of Related Art

Frequency conversion of signals is primarily accomplished by a frequency mixer element. The frequency mixer multiplies two or more input signals in the time domain or convolves one or more input signals in the frequency domain. For example, for certain frequency conversion applications, the frequency mixer mixes an input signal having a frequency f1 and a local oscillator signal having a frequency f2. By mixing these signals, the mixer produces first order frequency mixed signal components having the frequencies f1+f2 and |f1−f2| with the amplitude or shape characteristics of the input signal. If frequency upconversion is desired, the lower frequency signal component is filtered out to leave an upconverted signal, and if frequency downconversion is desired, the higher frequency signal component is filtered out to leave a downconverted signal.

The mixing of the input signal and the local oscillator signal, however, also generates intermodulation distortion. In general, intermodulation distortion results from spurious combination frequency components in the output of a non-linear element when two or more sinusoidal signals form the input. Intermodulation distortion of a complex wave (having multiple frequency components) arises from intermodulation of the components in the complex wave by each other in a nonlinear system, producing waves having frequencies, among others, equal to the sums and differences of the components of the original wave. The power level of the intermodulation distortion generated by a mixer depends upon the input signal power level. Typically, for an increase in input signal power level, the mixer generates a corresponding increase in output signal power level with an even greater increase in the power level of the intermodulation distortion. As such, the highest acceptable power level of intermodulation distortion resulting from the corresponding highest output signal power level defines a boundary for the dynamic range of the mixer. The dynamic range of the mixer can be defined for a given output power level as the difference between the output signal power level and the corresponding power level of the intermodulation distortion. Whether the dynamic range is acceptable depends on the particular application. If a given output signal power level exceeds the dynamic range of the mixer, this usually means that an unacceptable power level of intermodulation distortion is generated by the mixer along with the frequency mixed or converted signal components. Extending the dynamic range of the mixer allows the mixer to produce a greater range of output signal power levels without generating unacceptable levels of intermodulation distortion. For example, in an application where a mixer is operating in a 30 kHz bandwidth, a mixer can have a dynamic range of 100 dB defined by a high output signal amplitude of 0 dBm and a corresponding intermodulation distortion amplitude of −100 dBm. Extending the dynamic range of the mixer occurs by increasing the relative difference between the amplitudes of the output signal and the intermodulation distortion.

A frequency mixer with an extended dynamic range is desirable.

SUMMARY OF THE INVENTION

The present invention involves a frequency mixing system which provides an expanded dynamic range when compared to the dynamic range(s) of an individual mixer(s) that make up the arrangement. The frequency mixing system uses a feed-forward arrangement to reduce the distortion emanating from a single mixer due to a signal power level which would result in a frequency converted signal outside the dynamic range of the mixer. For example, the frequency mixing system splits an input signal onto a first path and a second path. On the first path, a first mixer frequency mixes the signal to produce a frequency converted signal with distortion, such as intermodulation distortion. On the second path, the amplitude of the signal is attenuated then frequency mixed by a second mixer to produce a frequency converted signal with a low and/or insignificant level of distortion. The first mixer element produces a frequency converted signal with distortion because the signal on the first path enters the first mixer at a power level resulting in a frequency converted signal outside the dynamic range of the first mixer. As such, the higher power level of the signal into the first mixer creates distortion that emanates from the first mixer along with the frequency converted signal. Since the attenuated signal on the second path enters the second mixer at a lower power level resulting in a frequency converted signal within the dynamic range of the second mixer, the second mixer produces the frequency converted signal with the low and/or insignificant level of distortion. After the signals on the first and second paths are frequency converted, the frequency converted signal and distortion are coupled from the first path and combined with the frequency converted signal on the second path, producing the distortion as the prominent signal on the second path. The distortion on the second path is then combined with the frequency converted signal and distortion on the first path to cancel the distortion on the first path and produce the desired frequency converted signal. Because the frequency mixing system produces the desired frequency converted signal with reduced distortion as compared to the distortion produced if the original input signal would be frequency converted using only the first mixer, the frequency mixing system provides an extended dynamic range.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
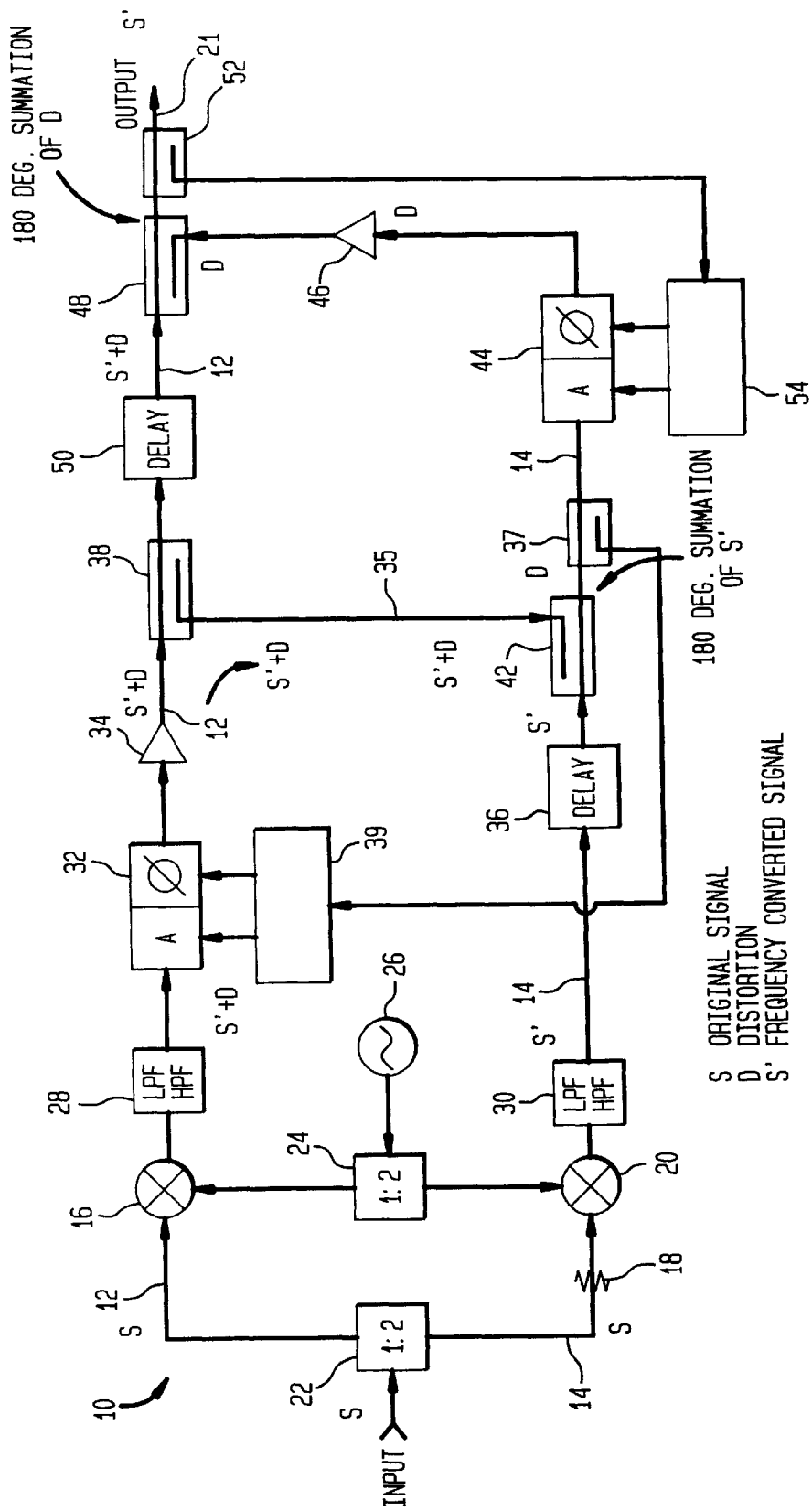
FIG. 1 shows a general block diagram of an embodiment of a frequency mixer system with extended dynamic range according to the principles of the present invention.

Illustrative embodiments of a frequency mixing system with expanded dynamic range according to the principles of the present invention are described below. With particular reference to FIG. 1, a mixer arrangement 10 receives an input signal S to be frequency mixed and places the input signal S onto a first path 12 and a second path 14. In this instance, the signal S has an amplitude which would result in a frequency converted signal outside the dynamic range of a first mixer 16 in that the mixing of the signal S by the first mixer 16 would generate an unacceptable power level of intermodulation distortion when compared to the frequency converted signal power level. The acceptable power level of intermodulation distortion when compared to the power level of the frequency converted signal is a design choice depending on the particular application. Typically, the dynamic range of the mixer is chosen for the particular application. In general, the dynamic range of the mixer is defined for a given output power level as the difference between the output signal power level and the corresponding power level of intermodulation distortion. A boundary for an acceptable dynamic range is generally established by the difference between the highest power level of the output signal corresponds to an acceptable power level for the intermodulation distortion. The highest acceptable power level of the intermodulation distortion is a bound on the dynamic range because the power level of the intermodulation distortion generally increases more with increasing input signal power than the corresponding increase in output signal power, especially at the upper boundary of the dynamic range. For example, if the output signal rises by 1 dB, the mixer 16 typically generates 3 dB more of intermodulation distortion. As such, for discussion purposes, an acceptable dynamic range can be defined in terms of the highest acceptable power level of intermodulation distortion.

Some definitions for dynamic range focus on the relative difference between the output signal level and the corresponding level of intermodulation distortion for a given range of input signals. Accordingly, extending the dynamic range results if 1) for a given output signal power level, the power level of the intermodulation distortion generated is reduced, 2) for a given power level of intermodulation distortion, the output signal power level is increased or 3) the relative difference increases between power levels of the output signal and the corresponding intermodulation distortion. As such, if for a given amplitude of intermodulation distortion, the resulting output signal amplitude can be increased without raising the amplitude of the intermodulation distortion, the dynamic range of the mixer is increased.

In this particular embodiment, the first mixer 16 mixes the signal S on the first path 12 with a continuous wave (CW) signal to produce the frequency-converted input signal S'. The input signal S could be an intermediate frequency (IF) transmitter signal (to be frequency upconverted to radio frequency) or a radio frequency (RF) receiver signal (to be downconverted to IF typically). The input signal S could also be a baseband signal being upconverted to IF in the transmitter, or an IF signal being downconverted to baseband in the receiver. In other mixing applications, the signal S can be mixed with other types of signals. Because the input signal S is outside the dynamic range of the first mixer 16, distortion D emanates from the first mixer 16 along with the frequency converted signal S'. On the second path 14, an attenuator 18 reduces the amplitude of the signal S and provides the signal S to a second mixer 20. The attenuator 18 reduces the amplitude of the signal S on the second path 14 such that the resulting frequency converted signal S' is produced with a low and/or insignificant level of distortion. In some embodiments, the attenuator 18 is a coupler which also splits the input signal S onto the first and second paths 12 and 14. The second mixer 20 can be the same type of mixer as the first mixer 16 to reduce operating differences. The second mixer 20 mixes the signal S on the second path 14 with the CW signal used by the first mixer 16 to produce a frequency converted signal S' on the second path. Again, because the signal S on the second path 14 enters the second mixer 20 at a low power level, the second mixer 20 generates the low and/or insignificant level of distortion, producing the frequency converted signal S' on the second path 14.

Using a feed-forward arrangement, a portion of the frequency converted signal S' and the distortion D is coupled from the first path 12 and combined with the frequency converted signal S' on the second path 14 to reduce the frequency converted signal on the second path 14, leaving the distortion D on the second path 14 as the prominent signal relative to the frequency converted signal S'. The distortion D on the second path 14 is then fed forward and combined at the output 21 with the frequency converted signal S' and the distortion D on the first path 12 to cancel the distortion D from the first path 12, thereby producing the desired frequency converted signal S'. The dynamic range of the mixer arrangement 10 is greater than the dynamic range of the first mixer 16 alone because for a given signal power level, the mixer arrangement 10 produces a desired frequency converted signal with a low level of distortion when compared to the distortion produced if the original input signal S would be frequency mixed by the first mixer 16.

Figure 2:
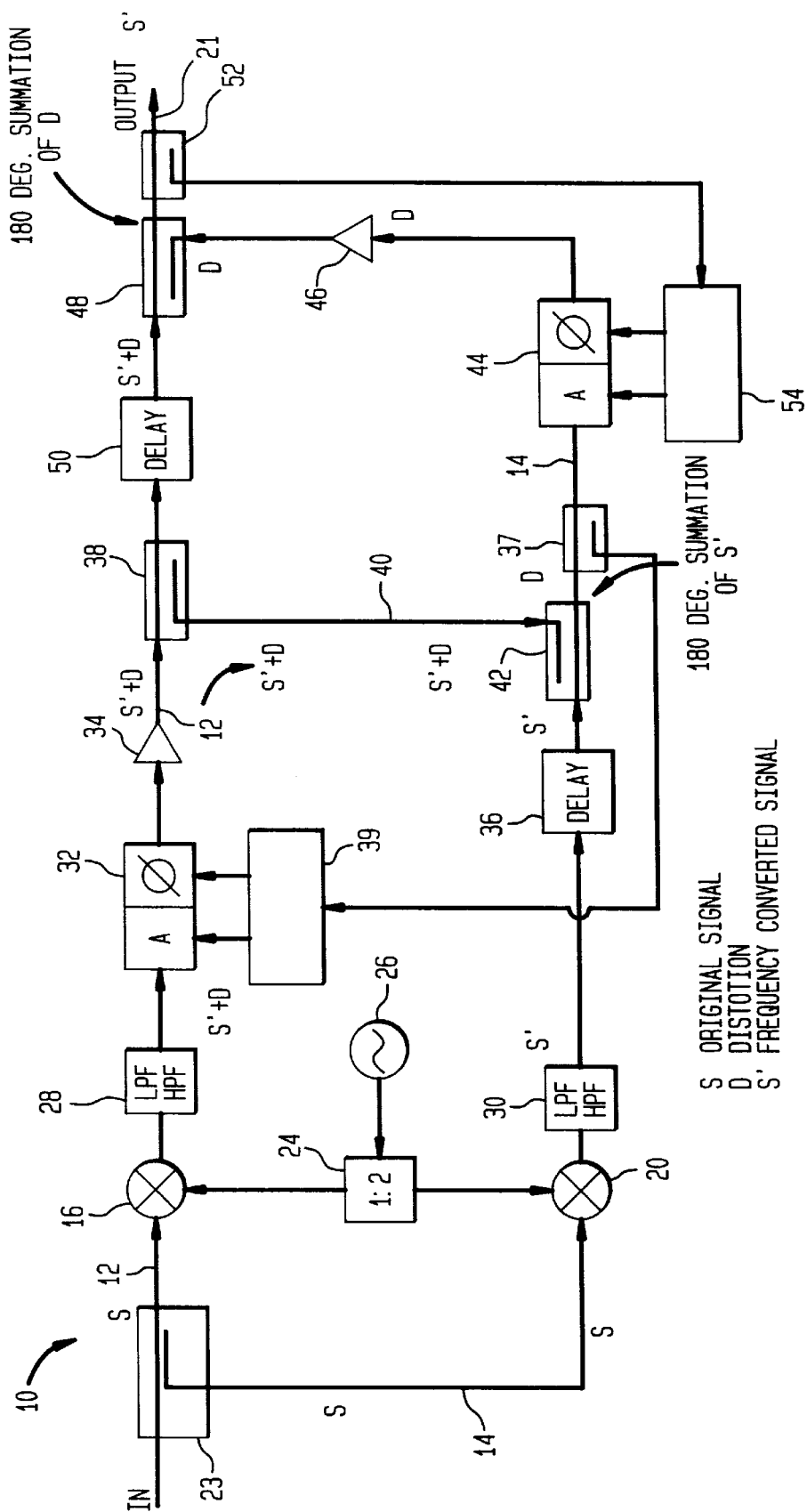
FIG. 2 shows a general block diagram of another embodiment of the frequency mixer system according to the principles of the present invention.

In the particular embodiment of FIG. 1, a 1:2 splitter 22 splits the input signal S onto the first path 12 and the second path 14. The signal S on the first path is provided to the first mixer 16, and the signal S on the second path 14 is provided to the second mixer 20 after being attenuated by attenuator 18. If the splitter 22 provides enough attenuation, then the attenuator 18 may not be necessary. Alternatively, a coupler can perform the splitting and attenuating provided by the splitter 22 and the attenuator 18. FIG. 2 shows an embodiment of the frequency mixer 10 in which a coupler 23 is used in place of the splitter 22/attenuator 18 pair. The coupler 23 couples and attenuates the signal S from the first path 12 to the second path 14 by 20 dB in this embodiment. Other coupling values and configurations are possible depending on the application.

In this particular embodiment, to reduce the differences in the frequency mixing of the signals S on the different paths 12 and 14, a 1:2 splitter 24 splits a CW signal from an oscillator 26 and provides the CW signals to the first mixer 16 and the second mixer 20. Providing the same local oscillator signal to the first and second mixers 16 and 20 is done to reduce any small variations which could be introduced in the parallel mixing and detrimentally effect the combining of the signals at the coupler 48. Along those lines, the first and second mixers 16 and 20 could be the same types of mixer, but depending on the application, different types of mixers can be used which receive signals from different sources. Additionally, the signals S on the different paths 12 and 14 can be mixed using signals having a varying frequency, multiple frequencies, and/or a modulated signal or pseudo-random noise signal.

On the first path 12, the first mixer 16 frequency mixes the signal S on the first path 12 using the CW signal. The frequency mixer 16 produces the frequency converted signal S at the desired frequency and with the amplitude or shape characteristics of the signal S, but because the amplitude of the signal S is such that the resulting frequency converted signal S' is outside the dynamic range of the mixer 16, the mixer 16 generates an unacceptable level of intermodulation distortion D. The mixer 16 also produces other undesired frequency-combination distortion signals. A filter 28 filters the output of the first mixer 16 to remove the other spurious or undesirable frequency signals on the first path 12 resulting from the mixing, thereby leaving the frequency converted signal S' and the distortion D on the first path 12. On the second path 14, the second mixer 20 frequency mixes the attenuated signal S at the desired frequency and with the amplitude or shape characterisitics of the signal S, and because the signal S is attenuated on the second path, the mixer 20 generates a low and/or insignificant level of distortion. A filter 30 filters the output of the second mixer 20 to remove from the second path 14 any spurious or undesirable frequency signals resulting from the mixing. Lowpass filters (LPF) are used for frequency downconversion, whereas highpass filters (HPF) are used for frequency upconversion.

An amplitude and phase adjuster 32 on the first path 12 amplitude and phase adjusts the frequency converted signal S' and the distortion D on the first path 12. The phase and amplitude of the frequency converted signal S' and the distortion D on the first path 12 are adjusted to provide improved cancellation of the frequency converted signal S' on the second path 14. In doing so, the frequency converted signal S' is coupled from the first path 12 onto a coupling path 35 and is used to combine with the frequency converted signal S' on the second path 14 to leave the distortion D from the first path 12 on the second path 14. In certain embodiments, a coupler 37 provides a portion of the output of the coupler 42 to control circuitry 39. The control circuitry 39 provides phase and amplitude adjustment signals to the phase and amplitude adjusters 32 to improve the cancellation of the frequency converted signal S' from the second path 20 at the coupler 42. Acceptable reduction or cancellation of the frequency converted signal S' can be accomplished with or without the coupler 37 and control circuitry 39 depending on the desired application. The phase and amplitude adjustments can be set, calculated or found in a look-up table based on measurements of the frequency converted signal S', such as the power level of the frequency converted signal S' remaining on the second path 14 after the combining of the signals S'. In some applications, the phase and amplitude adjustments could be relatively constant, or based on measurements of the frequency converted signal S' and D' prior to the adjuster 32. In any event, the adjuster 32, linear amplifier 34 and the couplers 38 and 42 are designed to reduce the signal S' at the output of the coupler 42 to make the distortion D the prominent signal on the second path 20.

A linear amplifier 34 is selected to amplify the frequency converted signal S' and the distortion D on the first path 12 to provide additional gain to match the amplitudes of the frequency converted signals S' on the second path 20 and on the coupling path 35, for example to provide an amplitude difference within 2 dB. To combine the frequency converted signals S' on the first and second paths 12 and 14 and produce the distortion D as the prominent signal on the second path 14, a coupler 38 couples off a portion of the frequency converted signal S' and the distortion D from the first path 12 onto the coupling path 35. A coupler 42 combines the frequency converted signals S' and D on the coupling path 35 with the frequency converted signal S' on the second path 14. As mentioned above, the frequency converted signal S' from the coupling path 35 and the frequency converted signal S' on the second path are combined at about 180 degrees out of phase to reduce each other, producing the distortion D at the output of the second coupler 42 as the prominent signal on the second path 14. Generally, the amplitudes of the frequency converted signals S' need not exactly match. If the amplitudes of the frequency converted signals S' are the same, and the frequency converted signals S' have a 180 degree phase difference, complete cancellation can be achieved at the coupler 42. Such a result is generally not necessary in reducing the frequency converted signal S' on the second path 14. Depending on the application, a phase difference of 175–185 degrees and an amplitude difference of 2 dB between the combining signals S' can be sufficient.

To equalize the delay of the second path 14 with the delay on the first path 12 primarily associated with the amplitude and phase adjuster 32 and the linear amplifier 34, a delay 36 on the second path 14 delays the frequency converted signal S' on the second path 14. Depending on the application, the delay 36 need not provide an exact equalization of the two delays, just enough delay such that the corresponding portions of the frequency converted signals S' on the first path 12 and the coupling path 35 can be combined in a manner that significantly reduces the frequency converted signal S' on the second path 14. Depending on the application, a delay difference on the order of picoseconds between the frequency converted signals S' at the coupler 42 may be acceptable.

The couplers 38 and 42 are used as summing and splitting elements, respectively. In this particular embodiment, the couplers 38 and 42 produce less loss on the main path (the first path 12 and the second path 14 respectively) than the 3 dB of loss that would be produced by conventional 3 dB summers or splitters which produce 3 dB of loss on both legs of the split or summation. In this particular embodiment, the couplers 38 and 42 produce low loss (for example, 0.5 dB respectively) on the first path 12 and the second path 14, respectively (which provides a reduced noise figure). The couplers 38 and 42 attenuate (for example, 10–20 dB respectively) the frequency converted signal S' and the distortion D split onto the coupling path 35 and summed into the second path 14.

The distortion D at the output of the coupler 42 on the second path 14 is amplitude and phase adjusted by an amplitude and phase adjuster 44. The amplitude and phase of the distortion D can be designed to provide a set amount of adjustment taking the operating parameters of the design components into consideration to reduce the distortion D at the output 21 of the mixer 10, thereby leaving the desired frequency converted signal S' as the prominent signal with a reduced level of intermodulation distortion. In certain embodiments, a coupler 52 at the output 21 obtains and provides a portion of the desired frequency converted signal S' and any remaining distortion D to control circuitry 54. The control circuitry 54 provides amplitude and phase adjustment signals to the amplitude and phase adjuster 44 to improve removal of the distortion D at the output 21. The adjustments can be calculated or found in a look-up table based on measurements of the distortion, such as the power level of the distortion D remaining on the first path 12 after the combining of the distortions D. In some applications, the phase and amplitude adjustments could be relatively constant, or based on measurements of the distortion prior to the adjuster 44. Depending on the design parameters, the robustness of the design, and the particular application, different components could be used or components removed from the design.

In this particular embodiment, after being amplitude and phase adjusted, the distortion D passes through a linear amplifier 46 which is designed to provide additional gain to match the amplitudes of the distortions D on the first and second paths 12 and 14. Generally, the amplitudes of the distortions D need not exactly match, for example an amplitude difference of 2 dB between the distortions D. If the amplitudes of the distortions D are the same, and the distortions D have a 180 degree phase difference, complete cancellation of the distortion D on the first path 12 can be achieved. Such a result is generally not necessary, for example a phase difference of 175–185 degrees with an amplitude difference of 2 dB between the distortions D. To equalize the delay of the first path 12 with the delay on the second path 14 primarily associated with the amplitude and phase adjuster 44 and the linear amplifier 46, the delay 50 delays the frequency converted signal S' and the distortion D on the first path 12. Delay equalization is provided such that the corresponding portions of the distortions D from the first and second path 12 and 14 can be combined at the coupler 48 to reduce the distortion D on the first path 12. The distortion D on the second path 14 produced from the linear amplifier 46 is coupled onto the first path 12 using the coupler 48. The distortion D from the second path 14 combines with the distortion D on the first path 12 to produce the desired frequency converted signal S' with a low level of distortion when compared to the distortion which would result if the original input signal were mixed using only the first mixer 16.

By producing the desired frequency converted signal with an acceptable level of distortion for a given signal power level outside the dynamic range of the mixer, the mixer arrangement has an expanded dynamic range. For example, if the dynamic range of the first mixer is 60 dB with a high output signal amplitude of 0 dBm and a corresponding intermodulation distortion level of −60 dBm, the dynamic range of the mixer system could be extended by 20 dB if the intermodulation distortion level is reduced to −80 dBm.

In addition to the embodiment described above, alternative configurations of the mixer arrangement according to the principles of the present invention are possible which omit and/or add components and/or use variations or portions of the described frequency converter. The amount of amplitude difference, phase difference and delay difference which is tolerated between combining signals depends on the particular application and the corresponding tolerance permitted by the application. These operating design parameters also can determine which components can be added, changed or omitted. For example, the mixer 10 is described with couplers 38, 42 and 48, but the couplers could be 3 dB summer/splitters, or other devices which can split or combine signals. Alternatively, the attenuator 18 and the splitter 22 could be implemented by couplers or other devices. Additionally, the delays can be implemented using passive devices, such as a passive filter, transmission line (coax, microstrip, or stripline), or active devices, such as amplifiers, active filters, digital delays or fiber, but active devices do introduce distortion. Furthermore, the locations of the amplitude and phase adjuster 32 and the associated delay 36 could be switched, and the locations of the amplitude and phase adjuster 44 and the associated delay 50 could also be switched.

As would be understood by one of ordinary skill in the art, the various components making up the frequency mixer and their respective operating parameters and characteristics, such as loss, should be properly matched up to provide the proper operation. For example, the mixers 16 and 20 can be the same type of mixers and can receive signals from the same source. Depending on the parameters chosen for the various components of the mixer arrangement, the total dynamic range can be changed. The frequency converted signal S' and the distortion D can be reconstructed at the output of the mixer arrangement with theoretically twice the dynamic range of one mixer. Alternatively, a mixer or mixers with lower and/or different dynamic range(s) could be used to provide a desired extended dynamic range at lower cost.

Furthermore, the frequency mixing system is described as receiving an input signal S to be frequency mixed. For discussion purposes, the input signal S is split onto the first path and second paths 12 and 14, and the resulting signals are referred to as S. On the first path 12, the converted signal is referred to as a composite signal of S and D. On the second path 14, the signal S is combined with the composite signal S with the distortion D to isolate the distortion D on the second path 14. It should be understood that different notations, references and characterizations of the various signals can be used. These designations were chosen for ease of discussion. Additionally, the frequency mixing system has been described using a particular configuration of distinct components, but it should be understood that the frequency converter and portions thereof can be implemented in application specific integrated circuits, software-driven processing circuitry, firmware or other arrangements of discrete components as would be understood by one of ordinary skill in the art with the benefit of this disclosure. Although in the illustrative embodiment is shown with a particular circuitry, the mixer arrangement can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of frequency converting a signal, comprising:
producing said signal onto a first path and a second path;
mixing said signal on said first path to produce a converted signal-with-distortion on said first path;
adjusting an amplitude and phase of said converted signal-with-distortion on said first path;
combining said amplitude and phase adjusted converted signal-with-distortion on said first path with a converted signal on said second path to generate a distortion signal on said second path; wherein the amplitude and phase of said converted signal-with-distortion on first path is adjusted by said distortion signal on said second path; and
combining said distortion signal on said second path with said converted signal-with-distortion on said first path to reduce said distortion signal on said first path.

2. The method of claim 1, further comprising:
attenuating said signal on said second path; and
mixing said attenuated signal on said second path to produce said converted signal on said second path.

3. The method of claim 2, wherein said mixing said attenuated signal includes using a continuous wave signal.

4. The method of claim 2, further including equalizing delays on said first and second paths.

5. The method of claim 2, wherein said steps of mixing include using mixers of the same type on said first path and said second path.

6. The method of claim 2, wherein said steps of splitting and attenuating are performed by the step of:
coupling said signal onto said second path.

7. The method of claim 1, wherein said step of combining said converted signal and distortion from said first path with a converted signal on said second path includes the steps of:
coupling said converted signal and said distortion from said first path onto a coupling path;
coupling said converted signal and distortion from said coupling path onto said second path.

8. A method of frequency converting a signal as in claim 1, further characterized in that adjusting the distortion on the first path and the distortion on the second path to be within a phase difference of between 175 and 185 degrees and an amplitude difference of 2 decibels.

9. A mixer arrangement, said arrangement comprising:

a splitting device for producing a signal on a first path and a second path;

a mixer on said first path to produce a converted signal with distortion on said first path;

an amplifier and phase adjuster to adjust an amplitude and phase of said converted signal with distortion on said first path:

a coupler arrangement connected between said first path and said second path for obtaining said amplified and phase adjusted converted signal with distortion from said first path and combining said amplified and adjusted converted signal with distortion obtained from said first path with a converted signal on said second path to reduce said converted signal on said second path and leave a distortion signal on said second path; and wherein the amplitude and phase of said converted signal-with-distortion on first path is adjusted by said distortion signal on said second path;

a coupler on said first path for combining said distortion signal on said second path with said amplified and phase adjusted converted signal with distortion on said first path to reduce said distortion signal of the amplified and phase adjusted converted signal with distortion on said first path.

10. The mixer arrangement of claim 9 further characterized in that:

an attenuator connected to said second path for attenuating said signal on said second path; and a mixer on said second path for mixing said attenuated signal on said second path to produce said converted signal on said second path.

11. The arrangement of claim 9 wherein said splitter and said attenuator are a coupler connected to said first and second paths.

12. The arrangement of claim 9, characterized in that said coupler arrangement includes:

a first coupler coupled to said first path and a coupling path for coupling said converted signal with distortion from said first path onto said coupling path; and a second coupler coupled to said coupling path and said second path for coupling said converted signal with distortion from said coupling path onto said second path.

13. The mixer arrangement of claim 9, characterized in that:

a linear amplifier that amplifies the distortion in the second path prior to the distortion being coupled to the first path.

14. The mixer arrangement of claim 13, further characterized in that the linear amplifier amplifies the frequency converted signal with distortion on the first path to provide additional gain to match the amplitudes of the frequency converted signals on the second path and on a coupling path to provide an amplitude difference within 2 decibels.

15. The mixer arrangement of claim 9, characterized in that:

a delay element provided in the second path that equalizes the delay of the first path and the delay of the second path.

16. The mixer arrangement of claim 9, characterized in that:

a filter that removes from the second path spurious or undesirable frequency signals which result from the mixing.

17. The mixer arrangement of claim 16, wherein:

the filter includes one or more lowpass filters for frequency downconversion.

18. The mixer arrangement of claim 16, wherein:

the filter includes one or more highpass filters for frequency upconversion.

19. The mixer arrangement of claim 9 further characterized in that:

an amplifier and phase adjuster adjusts an amplitude and phase of the distortion signal on said second path.

20. A mixer arrangement for producing a converted signal, said arrangement comprising:

a splitting device receives an input signal and splits said input signal onto a first path and a second path;

a mixer on said first path received said signal on said first path and mixes said signal to produce a converted signal-with-distortion on said first path;

an amplifier and phase adjuster to adjust an amplitude and phase of said converted signal-with-distortion on said first path;

a mixer on said second path receives said signal on said second path and mixes said signal to produce a converted signal on said second path;

a coupler on said first path couples said converted signal-with-distortion from said first path onto a coupling path;

a second coupler on said second path combines said converted signal-with-distortion on said coupling path with said converted signal on said second path to reduce said converted signal on said second path and leave a distortion on said second path; wherein the amplitude and phase of said converted signal-with-distortion on first path is adjusted by said distortion signal on said second path; and a third coupler combines said distortion on said second path with said signal-with-distortion on said first path to reduce a distortion on said first path.

21. A method of frequency converting a signal, comprising:

producing said signal onto a first path and a second path;

mixing said signal on said first path to produce a converted signal-with-distortion on said first path;

adjusting an amplitude and phase of said converted signal-with-distortion on said first path;

combining said amplitude and phase adjusted converted signal-with-distortion on said first path with a converted signal on said second path to generate a distortion signal on said second path;

wherein the amplitude and phase of said converted signal-with-distortion on first path is adjusted by said distortion signal on said second path;

adjusting an amplitude and phase of said generated distortion signal on said second path; and combining said adjusted distortion signal on said second path with said converted signal-with-distortion on said first path to reduce said distortion signal on said first path.

22. The method of claim 21, wherein the amplitude and phase of said generated distortion signal on said second path is adjusted by a signal from the combined said adjusted distortion signal on said second path with said converted signal-with-distortion on said first path.

* * * * *